United States Patent [19]

Schwuttke et al.

[11] 4,257,827
[45] Mar. 24, 1981

[54] HIGH EFFICIENCY GETTERING IN SILICON THROUGH LOCALIZED SUPERHEATED MELT FORMATION

[75] Inventors: Guenter H. Schwuttke, Poughkeepsie; Kuei-Hsiung Yang, Wappingers Fall, both of N.Y.

[73] Assignee: International Business Machines Corporation, Armonk, N.Y.

[21] Appl. No.: 93,485

[22] Filed: Nov. 13, 1979

[51] Int. Cl.³ .................... H01L 21/265; B23K 27/00
[52] U.S. Cl. ................................ 148/1.5; 148/187; 219/121 LE; 250/492 A; 357/91
[58] Field of Search ............... 148/1.5, 187; 357/91; 219/121 LE; 250/492 A

[56] References Cited

U.S. PATENT DOCUMENTS

| | | | |
|---|---|---|---|
| 3,585,088 | 6/1971 | Schwuttke et al. | 148/174 |
| 4,042,419 | 8/1977 | Heinke et al. | 148/1.5 |
| 4,053,335 | 10/1977 | Hu | 148/174 |
| 4,069,068 | 1/1978 | Beyer et al. | 148/1.5 |
| 4,131,487 | 12/1978 | Pearce et al. | 148/1.5 |
| 4,137,100 | 1/1979 | Zaleckas | 148/1.5 |
| 4,144,099 | 3/1979 | Edmonds et al. | 148/1.5 |
| 4,147,563 | 4/1979 | Narayan et al. | 148/1.5 |
| 4,151,008 | 4/1979 | Kirkpatrick | 148/1.5 |
| 4,155,779 | 5/1979 | Auston et al. | 148/1.5 |
| 4,181,538 | 1/1980 | Narayan et al. | 148/1.5 |

OTHER PUBLICATIONS

Bean et al., J. Appl. Phys., 50(2), (1979), 881.
Baeri et al., Phys. Rev. Letts., 41(18), (1978), 1246.
Baeri et al., J. Appl. Phys., 50(2), (1979), 788.
Auston et al., Appl. Phys. Letts., 34(9), (1979), 558.
Auston et al., Appl. Phys. Letts., 34(11), 1979, 777.
Beyer et al., IBM-TDB, 20 (1978) 3122.
Bertolotti et al., J. Appl. Phys., 50(1), (1979) 259.
Hofker et al., Appl. Phys. Letts., 34(10), (1979), 690.

*Primary Examiner*—L. Dewayne Rutledge
*Assistant Examiner*—Upendra Roy
*Attorney, Agent, or Firm*—George O. Saile

[57] ABSTRACT

A semiconductor wafer into which devices such as an integrated circuit is to be formed is gettered by regions in the wafer activated by a laser beam. The laser beam is directed onto the surface of the wafer opposite to that where the devices are to be formed. The power input to the laser is controlled such that the surface temperature of the region of the semiconductor wafer where the laser beam is applied first reaches the melting point of the material, such as silicon, and the melting commences. Then the temperature in the melt rises above the melting temperature, but stays below the boiling temperature of the material of the wafer. A superheated melt is formed. The result is that the solid-liquid interface moves deep into the material. The position of the melt is directly under the laser beam. The solidified material is positioned behind the beam as the beam scans the wafer. A depression is formed under the beam while the material rises behind the laser beam. This depression effect of the laser beam causes the beam to penetrate relatively deeply into the material. The superheated melt of this type has been found to be useful in the activation of internal gettering centers as opposed to crystal damage by a higher powered laser beam. These internal gettering centers, which may be oxygen complexes or the like, then act as gettering sites for unwanted impurities during subsequent heat treatment of the semiconductor wafer.

10 Claims, 9 Drawing Figures

HIGH EFFICIENCY GETTERING IN SILICON THROUGH LOCALIZED SUPERHEATED MELT FORMATION

TECHNICAL FIELD

The invention relates to methods for manufacturing integrated circuits wherein unwanted impurities or crystal defects are gettered from the device regions.

BACKGROUND ART

An economical determinant of integrated circuit process technology is the yield, that is the percentage of the total number of chips processed that are good. Often, bad chips are caused by devices wherein they fail to operate because of excessive leakage currents. The yield of complex integrated circuits is typically a few percent. One major factor that affects this yield is the presence of crystal defects in silicon, or other semiconductor wafers on which integrated circuits are built. These crystal defects can be classified into two kinds: the native defects, such as dislocations, stacking faults, and clusters of self-interstitials and vacancies; and the extraneous defects, such as contaminants of elements different from the semiconductor substrates. Dislocations are introduced in high temperature processing because of nonideal thermal conditions (see for example, K. Morezane and P. S. Gleim, J. Appl. Phys. 40, 4104 (1969); S. M. Hu, App., Phys. Lett. 22, 261 (1973)), whereas stacking faults are introduced either during epitaxial growth when the substrates are not appropriately cleaned (see, for a review, B. A. Joyce, Rept. Prog. Phys. 37, 363–420 (1974), or during thermal oxidation when the substrates contain other kinds of point defect clusters serving as nucleation sites (see, for example, D. J. D. Thomas, Phys. Stat. Solidi 3, 2261 (1963); S. M. Hu, Appl. Phys. Lett. 27, 1965 (1976). Clean native defects, in general, are not harmful electrically by themselves to any practical extent. However, they interact with extraneous impurities and become harmful. One example is the formation of transistor "pipes", commonly though as formed by enhanced diffusion of emitter or subcollector dopants along dislocations traversing transistor bases (for example, see F. Barson, M. S. Hess and M. M. Roy, J. Electrochem. Soc. 116, 304 (1969); G. H. Plantinga, IEEE Trans. Electron Devices ED-16, 394 (1969)). Another example is the role of vacancy/interstitial clusters, stacking faults, and dislocations serving as nucleation centers for the precipitation of fast diffusing impurities such as copper (for example, see S. M. Hu and M. R. Poponiak, J. Appl. Phys. 43, 2067 (1972); Phys. Stat. Solidi (a) 18, KS, (1973)), and other fast diffusing impurities such as iron, nickel, gold, etc.

As early as 1960, it was recognized that precipitates of such fast diffusing impurities as copper, iron, nickel, etc. may act to facilitate the recombination/generation of electron-hold pairs, leading to excessively high reverse leakage currents. With this recognition, Goetzberger and Shockley (J. Appl. Phys. 31, 1831 (1960)) first suggested the use of boron or phosphorus doped silicate glass layers to getter these detrimental impurities (see also, S. W. Ing., Jr., et al. J. Electrochem. Soc. 110, 553 (1963)).

As the integrated circuit processing becomes more complex and lengthy, the changes of contamination, during each of the processing steps, become greater and greater. To rely on the high purity of the starting wafers and the meticuluous cleanliness is no longer without risk. Therefore, other gettering processes have been proposed. These include the diffusion of phosphorus or boron into the silicon wafers, for examples, see M. R. Poponiak, W. A. Keenan, and R. O. Schwenker, in Semiconductor Silicon/1973, H. R. Huff and R. R. Burgess, editors, p. 701, Electrochemical Society Softbound Symposium Series, Princeton, N.J.; R. L. Meek, T. E. Seidel and A. G. Cullis, J. Electrochem. Soc. 122, 786 (1975); J. L. Lambert and M. Reese, Solid-State Electron. 11, 1055 (1968); mechanical damages on the wafer backsides, for examples, see E. J. Metz, J. Electrochem. Soc. 112, 420 (1965) and J. E. Lawrence U.S. Pat. No. 3,905,162, Sept. 16, 1975; ion implantation, for example, see T. M. Buck, K. A. Pickar, J. M. Poate and C. M. Hsieh, Appl. Phys. Lett. 20, 485 (1972); Appl. Phys. Lett 22, 238 (1973) and "Impact Sound Stressing for Semiconductor Devices", U.S. Pat. No. 4,018,626 issued Apr. 10, 1977, to G. Schwuttke et al. All these methods involve, in one form or another, certain disorders worked into the substrates.

Such disorders, mechanical damages in particular, can often propagate through the silicon wafers into the active device areas unless later thermal processes are carried out under extremely idealized conditions that are often not met.

Such damages are also difficult to quantify and control. In the case of ion implantation damages, the damaged layers are often too shallow, and may be easily removed during such later processing as oxidation and etching. Furthermore, improper thermal processing may often anneal out such implantation damages, making later thermal processing procedure not easily optimized or compatible.

U.S. Pat. No. 4,018,626 to Schwuttke, et al, and U.S. Pat. No. 4,069,068 to Beyer, et al, suggest the use of a laser for gettering purposes. Pearce, et al, U.S. Pat. No. 4,131,487 is directed to a method for use of a laser with a high energy beam with sufficient power to vaporize the semiconductor material and produce lattice damage and strain in the semiconductor wafer. Each of these patents require that lattice damage is produced to act as gettering sites.

SUMMARY OF THE PRESENT INVENTION

Accordingly an object of this invention is to provide a method for gettering contaminents, defects or the like to a major surface of a semiconductor body wherein mechanical damage, as such, is not utilized. Gettering centers are formed by use of a laser beam which is under a controlled power in a manner that allows the laser beam to increase the surface temperature of the semiconductor body at the point of incidence of the beam to the melting point of the semiconductor material but below the boiling temperature of the semiconductor material. The laser beam is then scanned over the surface so that the solid-liquid interface moves deep into the semiconductor material forming a depression under the laser beam while the material rises behind the laser beam. The major surface to which the laser beam is applied is preferably the side of the body opposite to which integrated circuit devices are to be formed. However, it is possible and sometimes advantageous to utilize as the major surface the side of the body in which the semiconductor devices are to be formed. In this later alternative wherein the semiconductor body contains many defects and stacking faults, the present method can be effective to reduce these defects and stacking faults in the surface that, for example, solar cell devices are to be formed.

DISCLOSURE OF THE INVENTION

Figure 1:
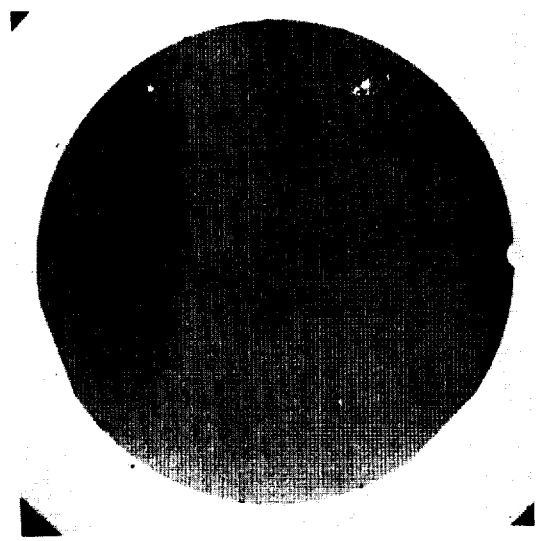
FIG. 1 is an X-ray topograph of a high energy laser beam scribed silicon wafer.
Figure 2:
FIG. 2 is a photomicrograph of certain laser scribed lines of FIG. 1 after heat treatments.

Referring now more particularly to FIGS. 1 and 2, there is shown a prior art high laser power damage gettering structure. A laser of high power is scanned across a semiconductor, for example silicon, wafer. The energy is so great that the silicon material is evaporated and a kerf is cut in the wafer. The depth of the kerf depends upon the power input. Rapid cooling of the kerf upon moving the laser beam introduces tiny cracks into the material. Subsequent annealing during semiconductor processing generates dislocations in the material. These damage dislocations are useful as a gettering mechanism in silicon wafers to improve the minority carrier lifetime in such silicon wafers. The X-ray topograph of FIG. 1 shows such a scribed wafer wherein the scribed lines or cuts are clearly visible. It is extremely critical to control the input power of the laser such that dislocations do not slip through to the opposite side of the wafer wherein integrated circuit devices are to be formed. FIG. 2 is a photomicrograph of two such scribed lines as shown in FIG. 1 wherein dislocations generated by laser damage propagate to wafer front side. This dislocation effect would cause a degradation of minority carrier lifetime in a MOS capacitor (circular dot in FIG. 2). This is the problem alluded to in the last two paragraphs in the background art section.

Figure 3:
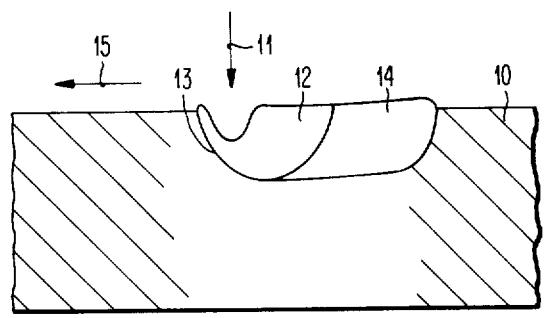
FIG. 3 is a schematic illustration of the method of the present invention.
Figure 4:
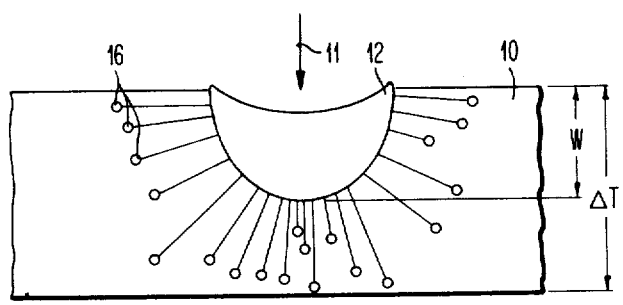
FIG. 4 is a cross section of the melt and base-solid interface taken perpendicular to the beam path shown in FIG. 3 at the steady state stage.

The present invention may be understood with reference to FIGS. 3 and 4 wherein a lower and more controlled laser power input is utilized which does not produce the dislocation damage structure described in the preceding paragraph. A semiconductor body or wafer 10 into which devices such as an integrated circuit is to be formed has a laser beam 11 directed onto the surface of the body or wafer. The power input to the laser is controlled such that the surface temperature of the region of the semiconductor body or wafer where the laser beam 11 is applied first reaches the melting point of the material and the melting commences in the liquidous region 12. The temperature in the melt 12 rises above the melting temperature, but stays below the boiling temperature of the material of the body. A superheated melt is formed. The result is that the solid-liquid interface 13 moves deeply into the semiconductor material 10. Position of the melt 12 is directly under the laser beam 11. The solidified material 14 is located immediately behind the laser beam 11 as the beam scans the wafer in the direction of the arrow 15. A depression is formed under the beam 11 while the material arises behind the laser beam as shown in FIG. 3. This depression effect of the laser beam causes the beam to penetrate relatively deeply into the material. A cross-section of the melt 12 and wafer 10 taken perpendicular to the beam path at the steady state stage is shown in FIG. 4.

A superheated melt of this type has been found to be very useful in the activation of internal gettering centers 16. Such centers, for example, are present in the silicon wafer particularly wherein the wafer contains oxygen complexes. FIG. 4 illustrates schematically the principle of this effect. If such oxygen complexes are activated by laser heat pulses, they grow and act as internal centers.

Figure 5:
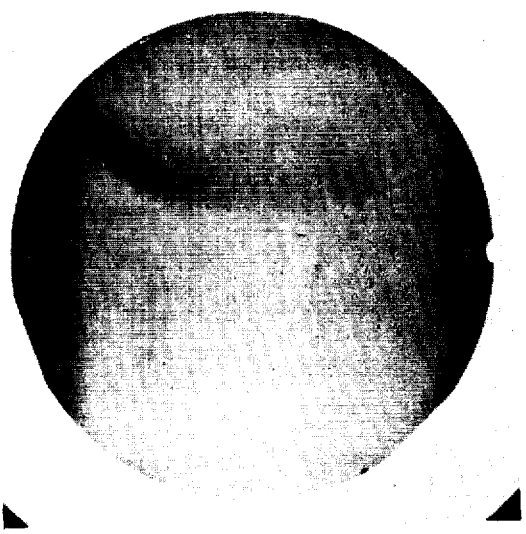
FIG. 5 shows an X-ray topograph of a silicon wafer with many laser scans according to the present invention.
Figure 6:
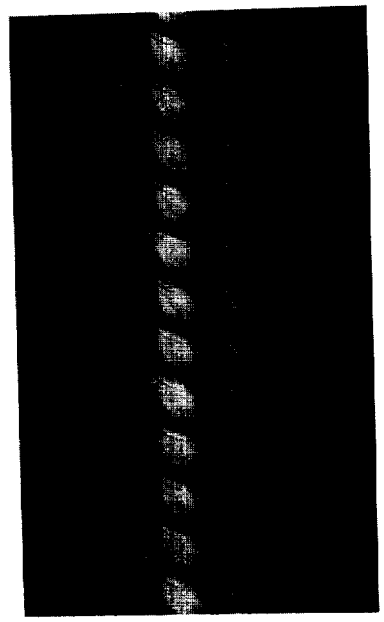
FIG. 6 is a photomicrograph of an actual laser scan made on the FIG. 5 silicon wafer according to the present invention.

An X-ray topograph of a silicon wafer with many scans in its surface and each scan at a distance of 0.5 milimeters is shown in FIG. 5. Note that this type of surface melting and solidifying does not introduce any crystal defects. Therefore, the laser scans are not visible in the topograph. This is contrary to the situation discussed in regard with the high power laser scan and illustrated in FIGS. 1 and 2. A photomicrograph of an actual laser low power scan made on silicon corresponding to the desired configuration is shown in FIG. 6.

The final step in the method of the present invention is the application of heat to effect the movement of defects, contaminants or the like to the internal gettering centers. The heating step may be a separate heating step not identified with any of the subsequent processing of the semiconductor body. Alternatively, where the gettering centers are formed in the semiconductor wafer prior to all or most of the integrated circuit processing, the high temperature step is simply the processing steps in forming the semiconductor integrated circuit. For example, oxidation of silicon is commonly used in formation of integrated circuit devices involving temperatures of 970° C. to 1000° C. Epitaxial deposition involve temperatures of above 1000° C. Post-aluminum annealing involves temperatures of 400° C.

The principles of gettering through superheated melt formation using a controlled powered laser as described above involves at least two gettering mechanisms as presently understood. The first mechanism involves the activation of internal gettering centers using optimum laser parameters to activate in silicon, for example, such centers containing oxygen complexes. Using this technique, it is preferable to apply the laser to the backside of the silicon body or wafer where the integrated circuit structures are to be produced on the front side of the semiconductor body or wafer. It should be understood that the method is useful in the manufacture of bipolar semiconductors, metal oxide semiconductor field effect transistor devices, or the like. The second gettering mechanism involves the dissolution of crystal defects. This mechanism is particularly valuable wherein the semiconductor body has a surface that contains many stacking faults and other defects. The result of the superheated melt formation process on such a surface is a defect-free surface layer that is created by disolving crystal defects in the melt followed by resolidification.

The dissolution of crystal defects technique is particularly useful to improve the efficiency of semiconductor solar cells. For the fabrication of, for example, silicon solar cells, low-cast silicon is commonly used. The low-cost silicon in general contains a high density of crystal defects, such as grain boundaries, dislocations and twins and a high concentration of metallic impurities. The superheated melt formation can be used to deactivate the grain boundaries, to dissolve dislocations and stacking faults. Thus, the above described process can be utilized to improve the efficiency of solar cells. In addition, the superheated melt formation process can be used to tailor the profile of the dopant concentration of the semiconductor body prior to the formation of the solar cell device.

The preferred conditions for the superheated melt laser process are as follows for a Nd: YAG laser:

| Laser: | Q-switch Nd: YAG laser at 1.06μm wavelength |
|---|---|
| $\frac{1}{e}$ Spot Size: | 115μm |
| Energy Density: | 5 to 10 Joules/cm² |
| Kerf Depth: | 1 to 7μm |
| Pulse Rate: | 5 to 15 KHz |
| Scan Speed: | 5 to 10 inches/sec |
| Line Spacing On Wafer: | 0.1 to 4mm |

The energy density can be somewhat increased as the 1/e spot size decreases.

The improvement in the quality of the semiconductor body or wafer may be evaluated in relation to minority carrier lifetime characteristic. The minority carrier lifetime in silicon is measured using MOS capacitors. The lifetime is determined from the C-t (Capacitance-Time) transient response of the MOS devices as described, for example, in W. R. Fahrner et al, J. Electrochem. Soc. 123, 100 (1976). The effectiveness of the laser superheated melt process may be evaluated by comparing the minority carrier lifetimes obtained in the wafer halves which are laser gettered versus the non-laser gettered halves. This is illustrated in Table I.

TABLE I

| Sample | Lifetime Range μsec | Avg. Lifetime μsec | Yield ≧ 1 μsec % |
|---|---|---|---|
| Gettered | 0.01 ~ 1657 | 298 | 82.9 |
| None | 0.001 ~ 3.17 | 0.57 | 18.2 |

Table I shows the distribution of lifetime for laser gettered and non-gettered halves. For the non-gettered half, the yield for lifetime higher than 1 microsecond is only 18.2%. For the gettered half, the yield improves to 82.9%. The average lifetime increases from 0.57 μsec for the non-gettered half to 298 μsec for the gettered half.

The use of laser gettering to dissolve crystal defects and thus improve lifetime is given in Table II.

TABLE II

| Ex. | AR Ion Implant Dose (in Ions/cm²) | Before Treatment | Lifetime (in μsec) Energy Density, Joules/cm² | | | | |
|---|---|---|---|---|---|---|---|
| | | | 0 | 3.4 | 3.9 | 4.3 | 4.7 |
| 1 | 10¹⁴ | 0.001 | 0.01 | | | 4.53 | 7.35 |
| 2 | 10¹⁴ | 0.001 | 0.05 | 0.05 | 4.80 | | |
| 3 | 10¹⁴ | 0.000 | 0.01 | | | 1.15 | 1.02 |
| 4 | 10¹⁵ | 0.023 | 0.008 | 0.007 | 0.062 | | |

TABLE II-continued

| Ex. | AR Ion Implant Dose (in Ions/cm²) | Before Treatment | Lifetime (in μsec) Energy Density, Joules/cm² | | | | |
|---|---|---|---|---|---|---|---|
| | | | 0 | 3.4 | 3.9 | 4.3 | 4.7 |
| 5 | 10¹⁵ | 0.015 | | | | 1.24 | 2.35 |
| 6 | 10¹⁶ | 0.007 | 0.007 | 0.006 | 0.002 | | |
| 7 | 10¹⁶ | 0.001 | 0.009 | | | 0.320 | 0.807 |

The Table II shows that the lifetime of Example 1 is very low and around 0.01 microseconds in the area which has not been treated with superheated melt formation as indicated in the Table as zero energy density. The low lifetime results from generation of a high density of dislocation and stacking faults in the ion implanted layer during MOS processing. The samples were (100) silicon wafers doped with boron to 2 ohm-cm. These samples were then implanted with Argon at 80 Kev. with the dosage indicated in the Table II.

Figure 7:
FIGS. 7 & 8 are photomicrographs of a silicon wafer having dislocations and stacking faults.
Figure 8:
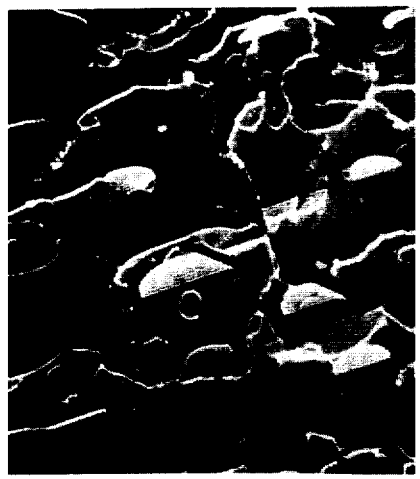
Figure 9:
FIG. 9 is a photomicrograph of the silicon wafer of FIGS. 7 and 8 after the method of the present invention was practiced on the FIGS. 7 and 8 silicon wafer.

FIGS. 7 and 8 show typical dislocations and stacking faults in the ion implanted wafers before the laser superheated melt process. The areas in Example 1 which have been treated with the laser superheated melt process show a substantial increase in minority carrier lifetime. The lifetime values are 4.54 and 7.35 microseconds for the areas which have been treated at an energy density of 4.3 and 4.7 joules/cm² respectively. This indicates that the laser superheated melt formation causes a minority carrier lifetime improvement of about 500 times that of the untreated area. The improvement results from the formation of a defect-free implanted layer generated by superheated melt formation. FIG. 9 in the photomicrograph of the silicon surface after the laser superheated melt process.

The Table II further shows the minority carrier lifetime for a group of Example 2 through 6 with an ion implant dose of between 10¹⁴ and 10¹⁶ ions per cm². The minority carrier lifetime for these samples as measured after implantation and before treatment by the MOS C-t technique is very low and in the range of 0.001 and 0.02 microseconds. The low minority carrier lifetime as described above results from the generation of dislocations and stacking faults in the ion implanted layer as shown in FIGS. 7 and 8. This group of samples is then subjected to the method of laser superheated melt at energy density of between 3.4 and 4.7 joules/cm². The initial state of these samples is different than that of Example 1. In Example 1 the initial state is an amorphous surface layer due to the implantation damage. On the other hand, the initial state for Example 2 through 6 is a surface layer containing a high density of dislocations in stacking faults generated by ion implantation damage during high temperature processing in the MOS fabrication. As indicated in Table I, the areas treated with the laser superheated melt method, in general, have a minority carrier lifetime value about 100 times higher than the non-treated areas (indicated as zero density energy).

While we have illustrated and described the preferred embodiments of our invention, it is to be understood that we do not limit ourselves to the precise constructions and methods herein disclosed and the right is reserved to all changes and modifications coming within the scope of the invention as defined in the appended claims.

We claim:

1. A method for gettering contaminants, defects or the like to major surface of a monocrystalline semiconductor body comprising:
   directing a laser beam onto the said surface of said body;
   applying controlled power to the said laser beam in a manner that the laser beam increases the surface temperature to the melting point of the semiconductor material but below the boiling temperature of the semiconductor material;
   scanning the said laser beam over said surface so that the solid-liquid interface moves deep into the semiconductor material forming a depression under the said laser beam while the material rises behind the said laser beam;
   heating the said wafer at a temperature and for time sufficient to getter said contaminants to gettering centers.

2. The method of claim 1 wherein the said semiconductor is silicon.

3. The method of claim 1 wherein the said major surface is the side of said body opposite to which integrated circuit devices are to be formed.

4. The method of claim 1 wherein the said major surface is the side of said body, in which semiconductor devices are to be formed.

5. The method of claim 4 wherein said devices are solar cell devices.

6. The method of claim 1 wherein the said scanning the said laser beam causes the activation of internal gettering centers spaced below the surface onto which said laser beam is scanning.

7. The method of claim 1 wherein the spacing of said scanning laser beam is between about 0.1 to 4 mm.

8. The method of claim 1 wherein said semiconductor is silicon and energy density through said power is between about 5 to 10 joules/cm$^2$.

9. The method of claim 1 wherein said laser a neodymium-YAG laser with a wavelength of 1.06 micrometers.

10. The method of claim 9 wherein said semiconductor is silicon, the spacing of said scanning laser beam is between about 0.5 and 4 mm and the energy density through said power is between about 5 to 10 joules/cm$^2$.

* * * * *